United States Patent
Ishikawa et al.

(10) Patent No.: US 7,313,048 B2
(45) Date of Patent: Dec. 25, 2007

(54) RESET DETECTION CIRCUIT IN SEMICONDUCTOR INTEGRATED CIRCUIT

(75) Inventors: Yasuyuki Ishikawa, Kariya (JP); Akira Suzuki, Nukata-gun (JP); Hideaki Ishihara, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/714,203

(22) Filed: Mar. 6, 2007

(65) Prior Publication Data
US 2007/0210834 A1   Sep. 13, 2007

(30) Foreign Application Priority Data
Mar. 10, 2006   (JP)   ............................. 2006-065958

(51) Int. Cl.
*G11C 29/52* (2006.01)
*G05F 1/10* (2006.01)
*G05F 3/02* (2006.01)

(52) U.S. Cl. ...................... 365/226; 365/228; 327/538; 327/545

(58) Field of Classification Search ................. 365/226, 365/228; 327/538, 545
See application file for complete search history.

(56) References Cited

FOREIGN PATENT DOCUMENTS

JP   2005-316594   11/2005

*Primary Examiner*—Evan Pert
(74) *Attorney, Agent, or Firm*—Posz Law Group, PLC

(57) ABSTRACT

A reset detection circuit for a logic circuit and a RAM includes a first determining circuit, a second determining circuit and a reset signal generating circuit. The first determining circuit operates with a first voltage and determines whether a second voltage is equal to or higher than a reset voltage for the logic circuit. The second determining circuit operates with the first voltage and determines whether the first voltage is equal to or higher than a minimum operating voltage as a guarantee voltage for an operation of the first determining circuit. The reset signal generating circuit outputs a reset signal for resetting the logic circuit and the RAM, when the first voltage is lower than the minimum operating voltage and the second voltage is lower than the reset voltage.

10 Claims, 7 Drawing Sheets

RESET DETECTION CIRCUIT IN SEMICONDUCTOR INTEGRATED CIRCUIT

CROSS REFERENCE TO RELATED APPLICATION

This application relates to and incorporates herein by reference Japanese Patent Application No. 2006-65958 filed on Mar. 10, 2006.

FIELD OF THE INVENTION

The present invention relates to a reset detection circuit provided in a semiconductor integrated circuit constructed in one microcomputer.

BACKGROUND OF THE INVENTION

Reset detection circuits are used to perform voltage drop detection and reset operation (JP 2005-316594A, for example). The reset detection circuit detects that a voltage VDD applied to a logic circuit and a RAM provided in a semiconductor integrated circuit has dropped below a reset voltage for the logic circuit or a guarantee voltage for retaining the charge of the RAM (RAM retention voltage). It then resets the logic circuit or performs other like operations, when this detection takes place.

A conventional reset detection circuit 100 includes, as shown in FIG. 5, a comparator 101, a reference voltage circuit 102, and voltage dividing resistors 103, 104.

The comparator 101 operates under power supply from a power supply line to which a voltage 5VIN of a 5V power source, formed by stepping down a 12V voltage generated by an in-vehicle battery or the like, is applied. Similarly, the reference voltage circuit 102 operates under power supply from the power supply line to which the voltage 5VIN of the 5V power source, formed by stepping down the voltage of 12V of the in-vehicle battery or the like, is applied, and generates a reference voltage Vref. The voltage dividing resistors 103, 104 are used to divide the voltage VDD of a power supply line for power supply to a logic circuit and RAM, and generate a voltage in proportion to the voltage VDD. The reference voltage Vref formed by the reference voltage circuit 102 is inputted to the non-inverting input terminal of the comparator 101, and the potential between the voltage dividing resistors 103, 104 is inputted to the inverting input terminal of the comparator 101.

In this reset detection circuit 100, the potential between the voltage dividing resistors 103, 104 is compared with the reference voltage Vref by the comparator 101, which determines whether the voltage VDD is equal to or higher than a reset voltage and a RAM retention voltage.

In this reset detection circuit 100, the following relation is so set that it is set as VDD>V-RST>V-MIN: the relation between the voltage VDD, the logic circuit reset voltage and RAM retention voltage V-RST, and the minimum operating voltage V-MIN of a circuit that uses the voltage 5VIN of the 5V power source as power supply voltage. For examples, these are so set that VDD=2.5V, V-RST=2.0V, and V-MIN=1.8V.

For this reason, it can be determined at the reset detection circuit 100 whether the voltage VDD is equal to or higher than the reset voltage and RAM retention voltage V-RST in all the following cases: when the power supply is started, when the battery is instantaneously disconnected, when the voltage VDD falls due to a surge, and when the power supply is stopped.

FIG. 6 is a timing diagram showing the situations that occur when power supply is started at time t1, when the battery is instantaneously disconnected at time t2, when the voltage VDD falls due to a surge at time t3, and when power supply stops at time t4.

As shown in this figure, the voltage VDD rises at time t1 after the voltage 5VIN of the 5V power source rises, and it rises to a desired potential. If the voltage 5VIN becomes equal to or higher than the minimum operating voltage V-MIN at this time, the operation of the comparator 101 that uses the voltage 5VIN as power supply voltage cannot be guaranteed. For this reason, the reset detection circuit 100 cannot detect that the voltage VDD has become lower than the reset voltage and RAM retention voltage V-RST. However, this is acceptable, because the voltage VDD is formed by stepping down the voltage 5VIN inside or outside a semiconductor integrated circuit and the voltage 5VIN rises earlier than the voltage VDD. For this reason, the reset detection circuit 100 can detects that the voltage VDD becomes equal to or higher than the reset voltage and RAM retention voltage V-RST when the power supply is started.

When the battery is instantaneously disconnected at time t2, the voltage 5VIN lowers with decrease in the battery voltage and the voltage VDD also lowers at the same time. Therefore, the voltage VDD becomes lower than the reset voltage and RAM retention voltage V-RST before the voltage 5VIN becomes lower than the minimum operating voltage V-MIN. For this reason, also, when the battery is instantaneously disconnected, the reset detection circuit 100 can detect that the voltage VDD has become lower than the reset voltage and RAM retention voltage V-RST.

When the voltage VDD falls due to a surge at time t3, the voltage 5VIN is not lowered. Therefore, the reset detection circuit 100 can detect that the voltage VDD has become lower than the reset voltage and RAM retention voltage V-RST. Surge is instantaneous voltage fluctuation due to noise or the like, and reset can also be triggered by a surge depending on a time constant or the like.

Also, when the power supply stops at time t4, similarly with instantaneous disconnection of the battery, the voltage VDD becomes lower than the reset voltage and RAM retention voltage V-RST before the voltage 5VIN becomes lower than the minimum operating voltage V-MIN. Therefore, the reset detection circuit 100 can detect that the voltage VDD has become lower than the reset voltage and RAM retention voltage V-RST.

In recent years, as semiconductor processes are miniaturized, the voltage VDD used as power supply for a logic circuit has been more and more lowered. Also, the reset voltage and RAM retention voltage V-RST has also been more and more reduced. On the other hand, the battery voltage and 5V power supply systems are used as the power supply for printed circuit boards mounted with a semiconductor integrated circuit and the like, and a 5V power source is also used for interfaces between a semiconductor integrated circuit and a printed circuit board.

For this reason, the following relation is often set as V-MIN>VDD>V-RST: the relation between the voltage VDD, the logic circuits reset voltage and RAM retention voltage V-RST, and the minimum operating voltage V-MIN of a circuit that uses the voltage 5VIN of a 5V power source as power supply voltage. For example, these are so set that VDD=1.5V, V-RST=1.2V, and V-MIN=1.8V.

In this instance, the reset detection circuit 100 constructed as illustrated in FIG. 5 cannot accurately detect that the voltage VDD has become lower than the reset voltage and RAM retention voltage V-RST in the following cases: when the power supply is started, when the battery is instantaneously disconnected, and when the power supply is stopped.

FIG. 7 is a timing diagram showing the situations that occur when the power supply is started at time t1, when the battery is instantaneously disconnected at time t2, when the voltage VDD falls due to a surge at time t3, and when the power supply stops at time t4, under a condition of V-MIN>VDD>V-RST.

When the power supply is started at time t1, a rise of the voltage VDD from the low level to the high level is completed before the voltage 5VIN becomes equal to or higher than the minimum operating voltage V-MIN because of the lowered voltage VDD. For this reason, the operation of the comparator 101 that uses the voltage 5VIN as the power supply voltage cannot be guaranteed. Therefore, the reset detection circuit 100 cannot detect that the voltage VDD has become lower than the reset voltage and RAM retention voltage V-RST.

In case of the instantaneous disconnection of the battery at time t2, when the voltage 5VIN lowers in conjunction with lowering of the battery voltage, the voltage VDD also lowers simultaneously. However, the voltage 5VIN becomes lower than the minimum operating voltage V-MIN before the voltage VDD becomes lower than the reset voltage and RAM retention voltage V-RST. For this reason, also, when the battery is instantaneously disconnected, the reset detection circuit 100 cannot detect that the voltage VDD has become lower than the reset voltage and RAM retention voltage V-RST.

With respect to a fall of the power supply from the high level to the lower level at time t4, similarly, the voltage 5VIN becomes lower than the minimum operating voltage V-MIN before the voltage VDD becomes lower than the reset voltage and RAM retention voltage V-RST. For this reason, also, when the power supply stops, the reset detection circuit 100 cannot detect that the voltage VDD has become lower than the reset voltage and RAM retention voltage V-RST.

Problems may arise if it cannot be accurately detected that the voltage VDD has become lower than the reset voltage and RAM retention voltage V-RST in the following cases, as described: when the power supply is started, when the battery is instantaneously disconnected, or when the power supply stops. For example, the logic circuit or RAM cannot be reset even though the voltage VDD has become lower than the reset voltage and RAM retention voltage V-RST.

SUMMARY OF THE INVENTION

The invention has an object of the invention to provide a reset detection circuit, wherein the following situation can be prevented when a power supply is started, when a battery is instantaneously disconnected, and when the power supply is stopped: a situation in which it cannot be accurately detected whether the voltage VDD is equal to or higher than a reset voltage and RAM retention voltage V-RST and thus a logic circuit or RAM cannot be reset.

A reset detection circuit for a logic circuit and a RAM includes a first determining circuit, a second determining circuit and a reset signal generating circuit. The first determining circuit operates with a first voltage and determines whether a second voltage is equal to or higher than a reset voltage for the logic circuit. The second determining circuit operates with the first voltage and determines whether the first voltage is equal to or higher than a minimum operating voltage as a guarantee voltage for an operation of the first determining circuit. The reset signal generating circuit outputs a reset signal for resetting the logic circuit and the RAM, when the first voltage is lower than the minimum operating voltage and the second voltage is lower than the reset voltage.

BRIEF DESCRIPTION OF THE DRAWINGS

The above and other objects, features and advantages of the present invention will become more apparent from the following detailed description made with reference to the accompanying drawings. In the accompanying drawings.

DETAILED DESCRIPTION OF THE PREFERRED EMBODIMENTS

First Embodiment

Figure 1:
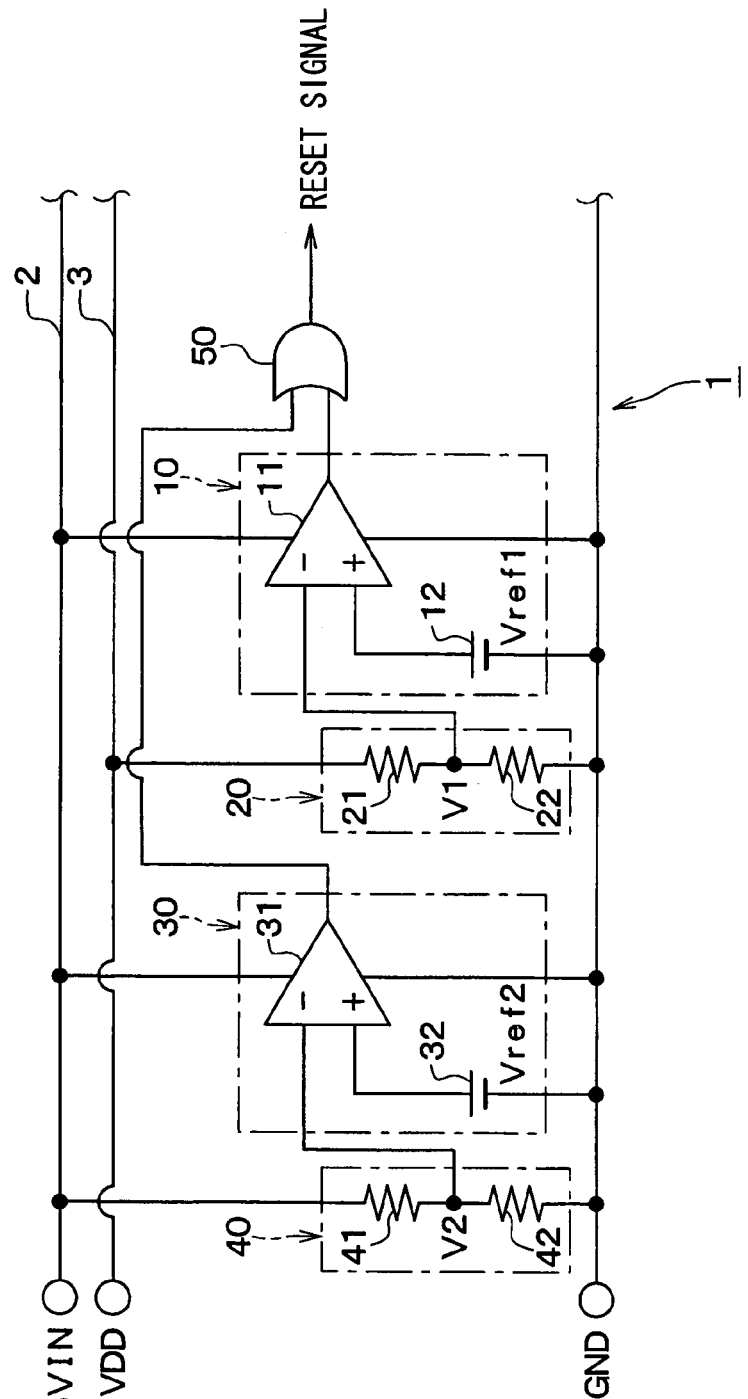
FIG. 1 is a circuit diagram of a reset detection circuit according to a first embodiment of the invention.

Referring first to FIG. 1, a reset detection circuit 1 is constructed to be driven under a voltage supply from a power supply line (first power supply line) 2 for supplying a voltage 5VIN (first voltage) supplied from a 5V power source (not shown). It is further constructed to detect whether the voltage VDD of a power supply line (second power supply line) 3 for supplying a voltage VDD (second voltage), formed by stepping down the voltage 5VIN inside a semiconductor integrated circuit, is equal to or higher than a logic circuit reset voltage and RAM retention voltage V-RST.

The reset detection circuit 1 includes a first threshold circuit 10, a first voltage dividing circuit 20, a second threshold circuit 30, a second voltage dividing circuit 40, and an OR circuit 50. The first threshold circuit 10 and the first voltage dividing circuit 20 form a first determining means; the second threshold circuit 30 and the second voltage dividing circuit 40 form a second determining means; and the OR circuit 50 forms a reset signal generating means.

The first threshold circuit 10 is so constructed that it includes a comparator 11 and a reference voltage circuit 12.

The comparator 11 operates under a power supply from the power supply line 2 to which the voltage 5VIN of the 5V power source, formed by stepping down a 12V voltage generated by an in-vehicle battery or the like, is applied. Similarly, the reference voltage circuit 12 operates under the power supply from the power supply line 2 to which the voltage 5VIN of the 5V power source is applied, and generates a reference voltage Vref1 as a first threshold value. This reference voltage Vref1 is set to a value equal to that of the voltage obtained by stepping down the logic circuit reset voltage and RAM retention voltage V-RST at a certain rate A. This reference voltage Vref1 is inputted to the non-inverting input terminal of the comparator 11.

The first voltage dividing circuit 20 is constructed of a voltage dividing resistor 21 and a voltage dividing resistor 22. It is used to step down the voltage VDD of the power supply line 3 through the voltage dividing resistor 21 and the voltage dividing resistor 22 at the certain rate A. The voltage between the voltage dividing resistor 21 and the voltage dividing resistor 22 in the first voltage dividing circuit 20 is taken as a first voltage V1. The resistance values of the voltage dividing resistor 21 and the voltage dividing resistor 22 are so set that the following is implemented: if the voltage VDD is divided through the first voltage dividing circuit 20 when the voltage VDD of the power supply line 3 becomes equal to the logic circuit reset voltage and RAM retention voltage V-RST, the first voltage V1 becomes equal to the reference voltage Vref1 set by the first threshold circuit 10.

Therefore, when the voltage VDD of the power supply line 3 is higher than the logic circuit reset voltage and RAM retention voltage V-RST, the first voltage V1 is higher than the reference voltage Vref1. The first voltage V1 formed by the first voltage dividing circuit 20 is inputted to the inverting input terminal of the comparator 11.

The rate A at which the first voltage dividing circuit 20 steps down the voltage VDD and the rate A at which the reference voltage Vref1 and the logic circuit reset voltage and RAM retention voltage V-RST to be compared therewith are stepped down are identical with each other. For this reason, the following can be implemented by comparing the first voltage V1 formed by the first voltage dividing circuit 20 with the reference voltage Vref1 in the first threshold circuit 10 for magnitude: it can be determined whether the voltage VDD is higher than the logic circuit reset voltage and RAM retention voltage V-RST.

The second threshold circuit 30 is so constructed that it includes a comparator 31 and a reference voltage circuit 32.

The comparator 31 operates under the power supply of the power supply line 2 to which the voltage 5VIN of the 5V power source, formed by stepping down the voltage generated by the in-vehicle battery or the like, is applied. Similarly, the reference voltage circuit 32 operates under the power supply from the power supply line 2 to which the voltage 5VIN of the 5V power source is applied. It generates a reference voltage Vref2 as a second threshold value. This reference voltage Vref2 is inputted to the non-inverting input terminal of the comparator 31.

The second voltage dividing circuit 40 is constructed of a voltage dividing resistor 41 and a voltage dividing resistor 42. It is used to step down the voltage 5VIN of the power supply line 2 connected to the 5V power source through the voltage dividing resistor 41 and the voltage dividing resistor 42 at a certain rate B. The voltage between the voltage dividing resistor 41 and the voltage dividing resistor 42 in the second voltage dividing circuit 40 is taken as a second voltage V2. The resistance values of the voltage dividing resistor 41 and the voltage dividing resistor 42 are so set that the following is implemented: if the voltage 5VIN is divided through the second voltage dividing circuit 40 when the voltage 5VIN of the power supply line 2 becomes equal to a voltage V-RST2 higher than the minimum operating voltage V-MIN, the second voltage V2 becomes equal to the reference voltage Vref2 set by the second threshold circuit 30.

Therefore, when the voltage 5VIN of the power supply line 2 is higher than the voltage V-RST2 higher than the minimum operating voltage V-MIN, the second voltage V2 becomes higher than the reference voltage Vref2. For this reason, the following can be implemented by comparing the second voltage V2 formed by the second voltage dividing circuit 40 with the reference voltage Vref2 in the second threshold circuit 40 for magnitude: it can be determined whether the voltage 5VIN is higher than the voltage V-RST2.

The OR circuit 50 receives outputs of the comparator 11 and the comparator 31, and produces an OR logic output. That is, when either the output of the comparator 11 or the output of the comparator 31 is high, the output of the OR circuit 50 is high. The output of the OR circuit 50 is used as a reset signal for the logic circuit and the RAM. During a period for which a high-level output is produced by the OR circuit 50, the logic circuit and the RAM are reset.

In the above reset detection circuit 1, the following relation is so set to satisfy V-RST2>V-MIN>VDD>V-RST among the voltage VDD, the logic circuit reset voltage and RAM retention voltage V-RST, the minimum operating voltage V-MIN of a circuit that uses the voltage 5VIN of the 5V power source as power supply voltage, and the voltage V-RST2. For example, these are so set that VDD=1.5, V-RST=1.2V, V-MIN=1.8V, and V-RST2=2.0V.

For this reason, it can be determined at the reset detection circuit 1 whether the voltage VDD is equal to or higher than the reset voltage and RAM retention voltage V-RST in all the following cases, as described below: when the power supply is started, when the battery is instantaneously disconnected, when the voltage VDD falls due to a surge, and when the power supply stops.

Figure 2:
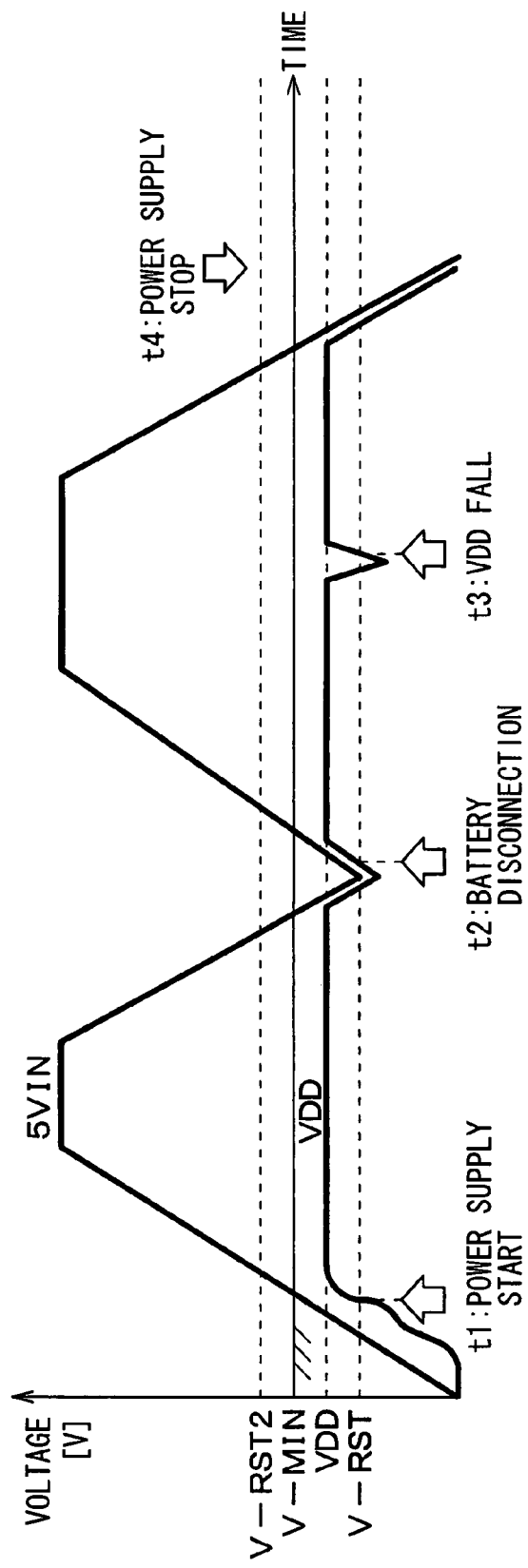
FIG. 2 is a timing diagram showing situations that occur when a power supply is started, when a battery is instantaneously disconnected, when a voltage VDD falls due to a surge, and when the power supply stops under a condition of V-RST2>V-MIN>VDD>V-RST.

FIG. 2 is a timing diagram showing the situations that occur when the power supply is started at time t1, when the battery is instantaneously disconnected at time t2, when the voltage VDD falls due to a surge at time t3, and when the power supply stops at time t4 under a condition of V-RST2>V-MIN>VDD>V-RST.

The voltage VDD can become equal to or higher than the reset voltage and RAM retention voltage V-RST at time t1 before the voltage 5VIN of the 5V power source rises and becomes equal to or higher than the minimum operating voltage V-MIN. At this time, there are no guarantees that the comparator 11 is normally operating before the voltage 5VIN becomes equal to or higher than the minimum operating voltage V-MIN. For this reason, if the output of the comparator 11 transitions from the high level to the low level in conjunction with increase in the voltage VDD, that is not always proper.

In this embodiment, meanwhile, the output of the comparator 31 is at the high level and the output of the OR circuit 50 is at the high level until the voltage 5VIN becomes higher than the minimum operating voltage V-MIN. Thus, even if the output of the comparator 11 transitions from the high level to the low level when the voltage 5VIN is lower than the minimum operating voltage V-MIN, the following is implemented: the logic circuit and the RAM can be reset until the voltage 5VIN becomes equal to or higher than the minimum operating voltage V-MIN. Therefore, the reset detection circuit 1 can detect that the voltage 5VIN becomes equal to or higher than the minimum operating voltage V-MIN and further can detect that the voltage VDD has become equal to or higher than the reset voltage and RAM retention voltage V-RST when the power supply is started.

When the battery is instantaneously disconnected at time t2, the voltage 5VIN lowers with decrease in the battery voltage. At this time, the voltage VDD also lowers. The voltage 5VIN can become lower than the minimum operating voltage V-MIN earlier than the voltage VDD lowers. In this case, there are no guarantees that it can be thereafter normally detected at the comparator 11 whether the voltage VDD has become lower than the reset voltage and RAM retention voltage V-RST.

In this embodiment, meanwhile, when the voltage 5VIN becomes lower than the minimum operating voltage V-MIN, the output of the comparator 31 concurrently transitions from the low level to the high level. For this reason, the logic circuit and RAM can be reset, regardless of the state of the voltage VDD, when the voltage 5VIN becomes lower than the minimum operating voltage V-MIN before the voltage VDD lowers. Therefore, also, when the battery is instantaneously disconnected, the reset detection circuit 1 can detect that the voltage 5VIN becomes lower than the minimum operating voltage V-MIN and further can detect that the voltage VDD has become lower than the reset voltage and RAM retention voltage V-RST.

When the voltage VDD falls due to a surge at time t3, the voltage 5VIN does not fall. Therefore, the reset detection circuit 100 can detect that the voltage VDD has become lower than the reset voltage and RAM retention voltage V-RST.

Also, when the power supply stops at time t4, the following can take place similarly as when the battery is instantaneously disconnected at time t3: the voltage 5VIN lowers in conjunction with decrease in the battery voltage and becomes lower than the minimum operating voltage V-MIN before the voltage VDD becomes lower than the reset voltage and RAM retention voltage V-RST. In this embodiment, also in this case, the following takes place similarly with the foregoing: when the voltage 5VIN becomes lower than the minimum operating voltage V-MIN, the output of the comparator 31 concurrently transitions from the low level to the high level. Also, when the power supply stops at time t4, therefore, the reset detection circuit 1 can detect that the voltage 5VIN becomes lower than the minimum operating voltage V-MIN and further can detect that the voltage VDD has become lower than the reset voltage and RAM retention voltage V-RST.

The reset detection circuit 1 in this embodiment is so constructed that the following is implemented when power supply is started, when the battery is instantaneously disconnected, when the voltage VDD falls due to a surge, and when power supply stops: it detects that the voltage 5VIN becomes lower than the minimum operating voltage V-MIN and further determines whether the voltage VDD is equal to or higher than the reset voltage and RAM retention voltage V-RST.

The logic circuit and the RAM are reset, regardless of whether the voltage VDD is equal to or higher than the reset voltage and RAM retention voltage V-RST, when the voltage 5VIN becomes lower than the minimum operating voltage V-MIN in the following cases: when the power supply is started, when the battery is instantaneously disconnected, and when the power supply stops. For this reason, the following situation can be prevented: the voltage 5VIN becomes lower than the minimum operating voltage V-MIN and it cannot be accurately detected whether the voltage VDD is equal to or higher than the reset voltage and RAM retention voltage V-RST; and thus the logic circuit or the RAM cannot be reset.

Second Embodiment

In the first embodiment, the voltage VDD forms a power supply VDD inside the semiconductor integrated circuit based on the voltage 5VIN generated by the 5V power source. In a second embodiment, although not shown, the power supply VDD is formed outside the semiconductor integrated circuit. The reset detection circuit 1 itself is the same as in the first embodiment.

When the power supply VDD is formed outside the semiconductor integrated circuit, the timing with which the voltage 5VIN rises and falls and the timing with which the voltage VDD rises and falls do not agree with each other. That is, the voltage VDD is built up independently of the voltage 5VIN. For this reason, the voltage VDD may rise and fall sufficiently earlier than the voltage 5VIN does, or conversely, the voltage VDD may rise and fall sufficiently later than the voltage 5VIN does.

However, with the reset detection circuit 1 illustrated in FIG. 1, the effect described with respect to the first embodiment can also be obtained in these cases.

Figure 3B:
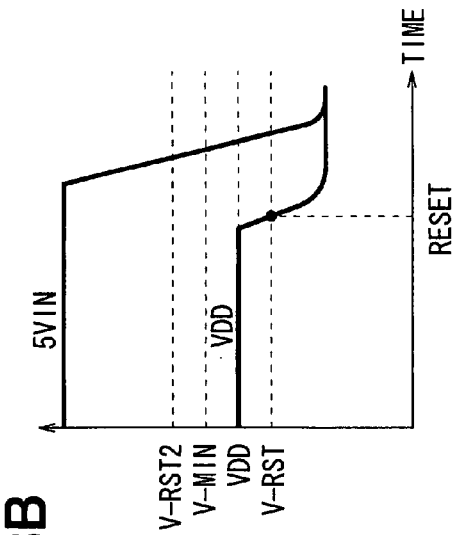
FIG. 3B is a timing diagram showing a situation that occurs when the voltage VDD falls sufficiently earlier than the voltage 5VIN does.
Figure 3D:
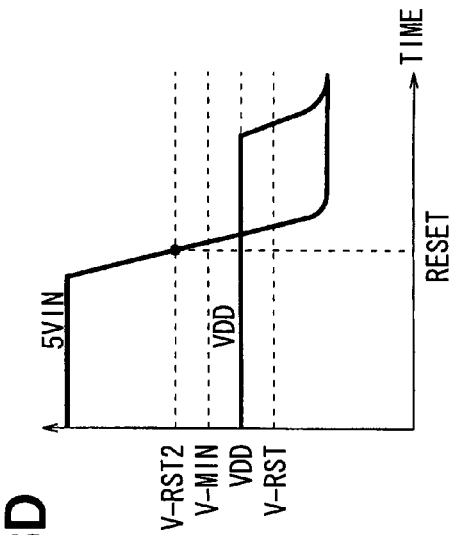
FIG. 3D is a timing diagram showing a situation that occurs when the voltage VDD falls sufficiently later than the voltage 5VIN does.
Figure 3A:
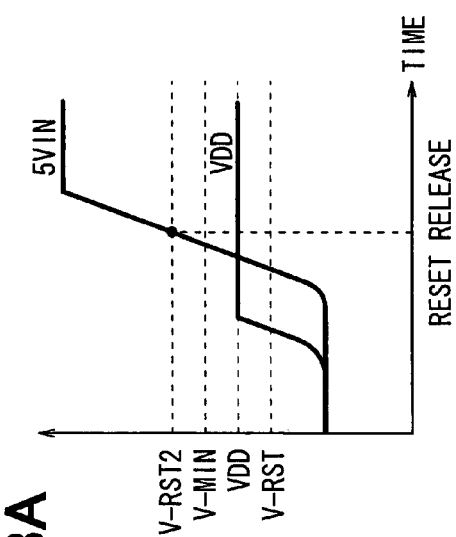
FIG. 3A is a timing diagram showing a situation that occurs when the voltage VDD rises sufficiently earlier than the voltage 5VIN does.
Figure 3C:
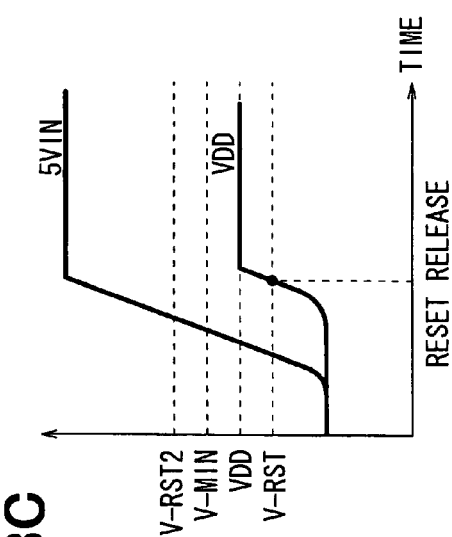
FIG. 3C is a timing diagram showing a situation that occurs when the voltage VDD rises sufficiently later than the voltage 5VIN does.

FIGS. 3A to 3D are timing diagrams illustrating situations that occur when the power supply is started and when the power supply is stopped. FIGS. 3A and 3B respectively illustrate cases where the voltage VDD rises and falls sufficiently earlier than the voltage 5VIN does. FIGS. 3C and 3D respectively illustrate cases where the voltage VDD rises and falls sufficiently later than the voltage 5VIN does.

When the voltage VDD rises sufficiently earlier than the voltage 5VIN does as illustrated in FIG. 3A, even though the voltage VDD becomes equal to or higher than the logic circuit reset voltage and RAM retention voltage V-RST, reset of the logic circuit and the RAM is not released until the voltage 5VIN becomes equal to or higher than the minimum operating voltage V-MIN.

When the voltage VDD falls sufficiently earlier than the voltage 5VIN does as illustrated in FIG. 3B, even though the voltage 5VIN is equal to or higher than the minimum operating voltage V-MIN, the logic circuit and the RAM are reset when the voltage VDD becomes lower than the logic circuit reset voltage and RAM retention voltage V-RST.

When the voltage VDD rises sufficiently later than the voltage 5VIN does as illustrated in FIG. 3C, reset of the logic circuit and the RAM is released when the voltage 5VIN becomes equal to or higher than the minimum operating voltage V-MIN and then the voltage VDD becomes equal to or higher than the logic circuit reset voltage and RAM retention voltage V-RST.

When the voltage VDD falls sufficiently later than the voltage 5VIN does as illustrated in FIG. 3D, even though the voltage VDD is equal to or higher than the logic circuit reset voltage and RAM retention voltage V-RST, the logic circuit and the RAM are reset when the voltage 5VIN becomes lower than the minimum operating voltage V-MIN.

As described above, the following operation is performed: it is detected that the voltage 5VIN becomes lower than the minimum operating voltage V-MIN and further it is detected whether the voltage VDD is equal to or higher than the reset voltage and RAM retention voltage V-RST; and when the voltage 5VIN becomes lower than the minimum operating voltage V-MIN, the logic circuit and the RAM are reset regardless of whether the voltage VDD is equal to or higher than the reset voltage and RAM retention voltage V-RST in the following cases: when the power supply is started and when the power supply is stopped.

Thus, even though the power supply VDD is formed outside the semiconductor integrated circuit, the following situation can be prevented: the voltage 5VIN becomes lower than the minimum operating voltage V-MIN and it cannot be accurately detected whether the voltage VDD is equal to or higher than the reset voltage and RAM retention voltage V-RST, and thus the logic circuit or the RAM cannot be reset.

Third Embodiment

In a third embodiment, it is assumed that values of the RAM retention voltage and a reset voltage for the logic circuit are different from each other.

Figure 4:
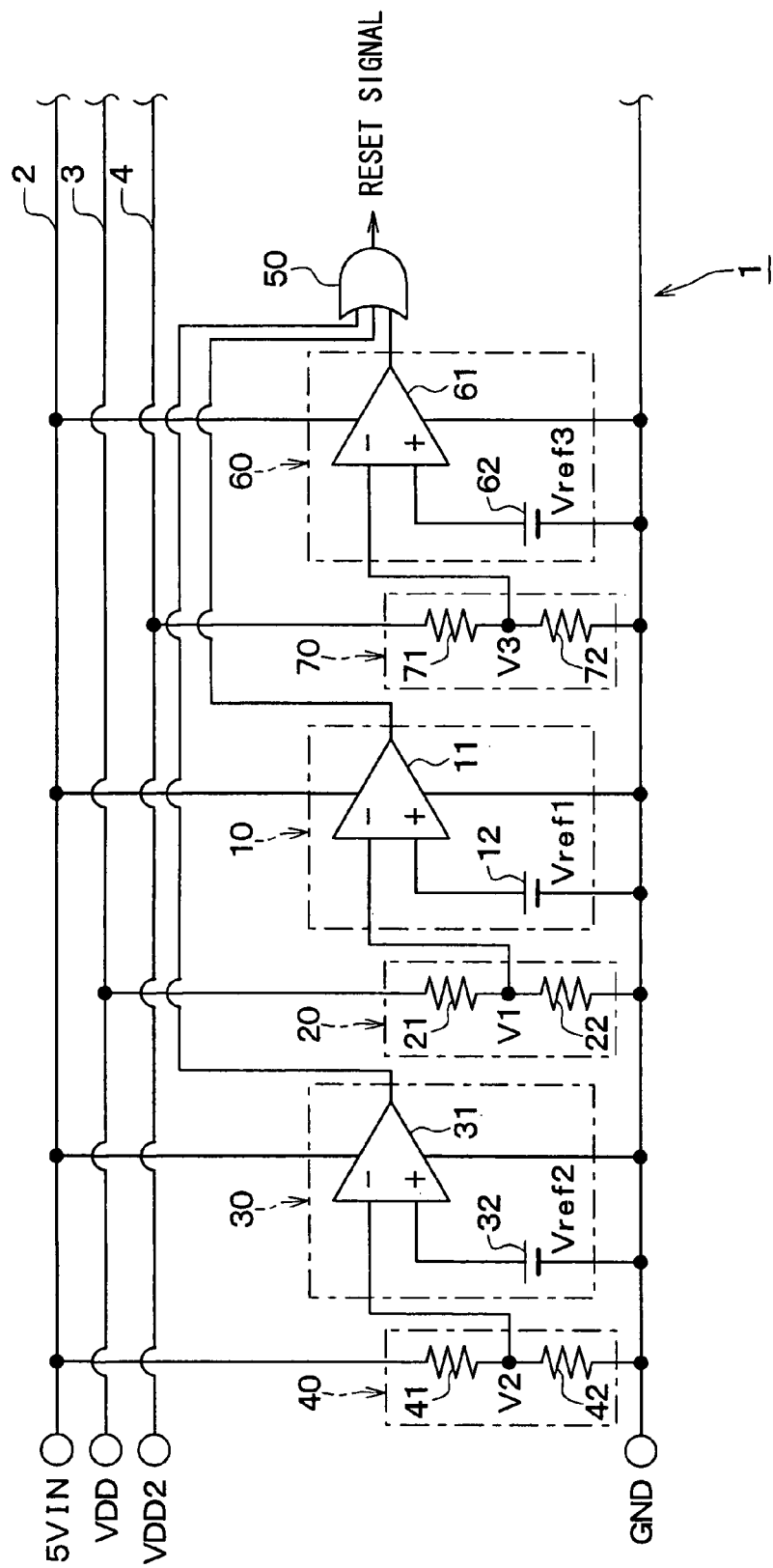
FIG. 4 is a circuit diagram of a reset detection circuit according to a third embodiment of the invention.
Figure 5:
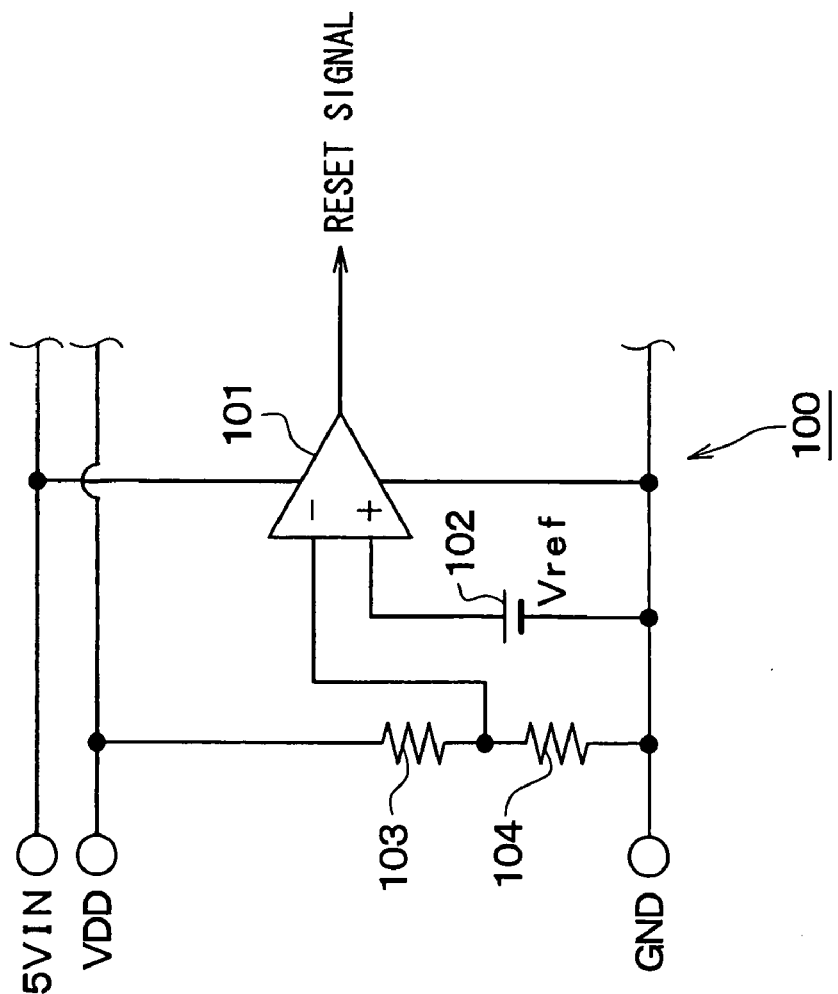
FIG. 5 is a circuit diagram of a conventional reset detection circuit.
Figure 6:
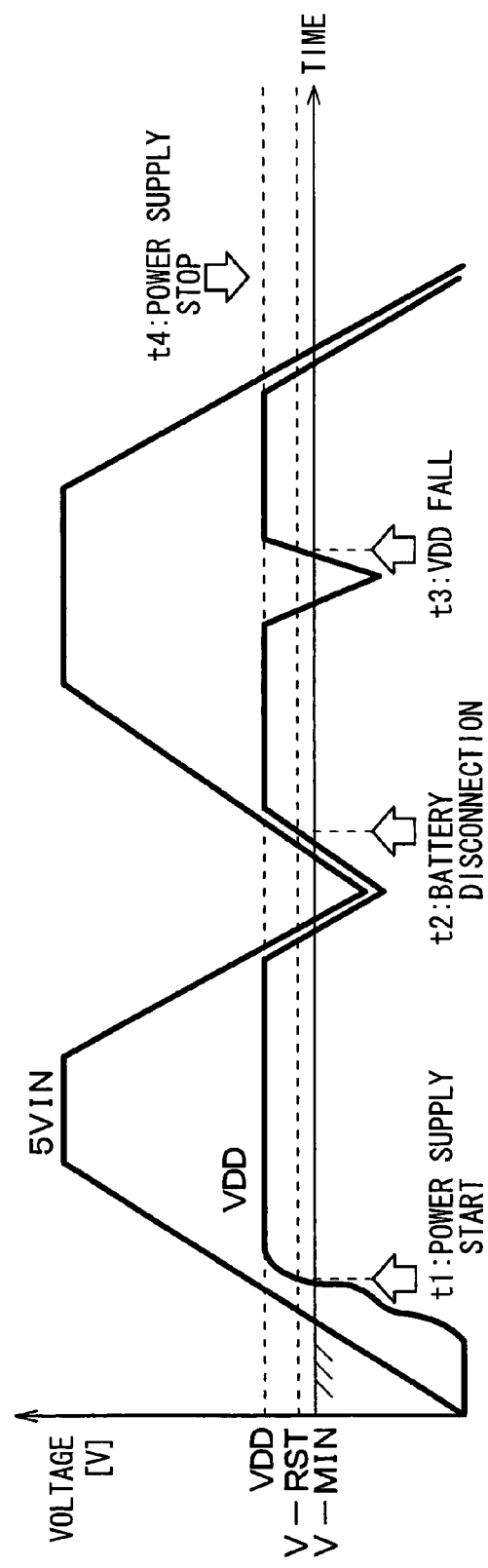
FIG. 6 is a timing diagram showing a situation that occurs when the power supply is started, when the battery is instantaneously disconnected, when the voltage VDD falls due to a surge, and when the power supply stops under a condition of VDD>V-RST>V-MIN.
Figure 7:
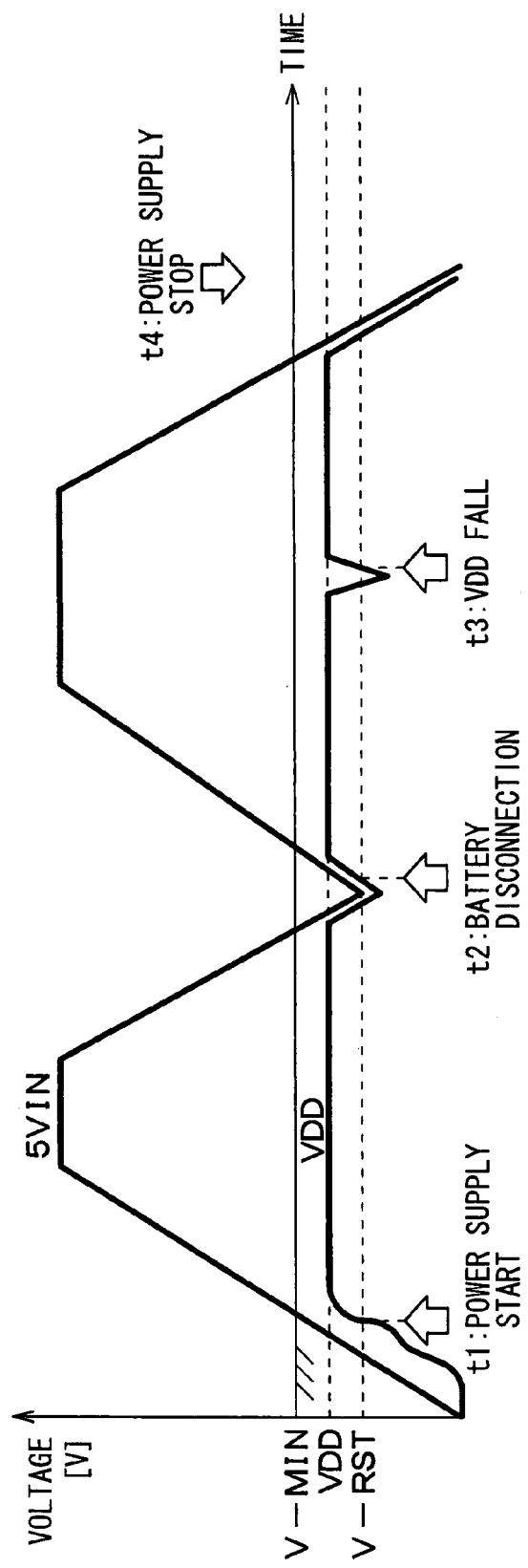
FIG. 7 is a timing diagram showing a situation that occurs when the power supply is started, when the battery is instantaneously disconnected, when the voltage VDD falls due to a surge, and when the power supply stops under a condition of V-MIN>VDD<V-RST.

As illustrated in FIG. 4, therefore, the detection of a RAM retention voltage V-RST, a third threshold circuit 60 and a third voltage dividing circuit 70 are added to the reset detection circuit 1 in the first embodiment. The third threshold circuit 60 and the third voltage dividing circuit 70 form a third determining means.

The third threshold circuit 60 is so constructed that it includes a comparator 61 and a reference voltage circuit 62.

The comparator 61 operates under the power supply from a power supply line (third power supply line) 4 that applies a voltage VDD2 different from the voltage of the power supply line 2. Similarly, the reference voltage circuit 62 operates under the power supply from the power supply line 2 to which the voltage 5VIN is applied, and generates a reference voltage Vref3. This reference voltage Vref3 is inputted to the non-inverting input terminal of the comparator 61.

The third voltage dividing circuit 70 is constructed of a voltage dividing resistor 71 and a voltage dividing resistor 72. It is used to step down the voltage VDD2 of the power supply line 4 through the voltage dividing resistor 71 and the voltage dividing resistor 72 at a certain rate C. The voltage between the voltage dividing resistor 71 and the voltage dividing resistor 72 in the third voltage dividing circuit 70 is taken as a third voltage V3. The resistance values of the voltage dividing resistor 71 and the voltage dividing resistor 72 are so set that the following is implemented: if the voltage VDD2 is divided through the third voltage dividing circuit 70 when the voltage VDD2 of the power supply line 4 becomes equal to the RAM retention voltage V-RST, the third voltage V3 becomes equal to the reference voltage Vref3 set by the third threshold circuit 60.

Therefore, when the voltage VDD2 of the power supply line 4 is higher than the RAM retention voltage V-RST, the third voltage V3 becomes higher than the reference voltage Vref3. The third voltage V3 formed by the third voltage dividing circuit 70 is inputted to the inverting input terminal of the comparator 61.

As mentioned above, the rate C at which the third voltage dividing circuit 70 steps down the voltage VDD2 and the rate C at which the reference voltage Vref3 and the RAM retention voltage V-RST' to be compared therewith are stepped down are identical with each other. For this reason, the following can be implemented by comparing the third voltage V3 formed by the third voltage dividing circuit 70 with the reference voltage Vref3 in the third threshold circuit 60 for magnitude: it can be determined whether the voltage VDD2 is equal to or higher than the RAM retention voltage V-RST'.

The reset detection circuit 1 is so constructed that the output of the comparator 61 in the third threshold circuit 60 is also inputted to the OR circuit 50. That is, when any of the output of the comparator 11, the output of the comparator 31, and the output of the comparator 61 is high, the output of the OR circuit 50 is high. The output of the OR circuit 50 is used as a reset signal for the logic circuit and the RAM. During a period for which the high level output is produced by the OR circuit 50, the logic circuit and the RAM are reset.

In this reset detection circuit 1, the following can be implemented when the power supply is started, when the battery is instantaneously disconnected, when the voltages VDD, VDD2 fall due to a surge, and when the power supply is stopped: it can be detected that the voltage 5VIN becomes lower than the minimum operating voltage V-MIN, and further it can be determined whether the voltage VDD is equal to or higher than the reset voltage V-RST or whether the voltage VDD2 is equal to or higher than the RAM retention voltage V-RST. Thus, the same advantage as in the first embodiment can be obtained.

Other Embodiments

In the first to third embodiments, the reference voltages Vref1 to Vref3 are different one another. These reference voltages may be identical. In this case, the resistance values of the voltage dividing resistors 21, 22, 41, 42, 71, 72 only have to be adjusted in the first to third voltage dividing circuits 20, 40, 70, and the reference voltage circuits 12, 32, 62 can be all constructed as one and the same circuit. For this reason, the circuitry can be simplified.

The reset detection circuit 1 produces the above advantage when the voltage VDD or the reset voltage V-RST becomes lower than the minimum operating voltage V-MIN. The invention is applicable to cases where the voltage VDD or the reset voltage V-RST becomes higher than the minimum operating voltage V-MIN.

In the above embodiments, only fall of the voltage VDD due to a surge is referred as an example of causes. In addition, GND short and power supply ripple can be referred to. A GND short occurs when the power supply line or the like to which the voltage VDD is applied is short-circuited to wiring connected to ground. This can cause the voltage VDD to fall. The power supply ripple is power supply fluctuation (alternating-current component) caused by current fluctuation (alternating-current component) in a circuit, such as logic, ROM, or RAM circuit, that makes a load to which the voltage VDD is applied. When the current fluctuation is great or a power supply that outputs the voltage VDD is low in speed of response, a power supply ripple occurs, and the voltage VDD can become lower than the reset voltage in some cases. Also, in these cases, a reset can be detected similarly as when the voltage VDD falls due to a surge.

What is claimed is:

1. A reset detection circuit for a logic circuit comprising:
   a first power supply line that supplies a first voltage; and
   a second power supply line that supplies a second voltage;
   a first determining means that operates with the first voltage and determines whether the second voltage is equal to or higher than a reset voltage for the logic circuit;

a second determining means that operates with the first voltage and determines whether the first voltage is equal to or higher than a minimum operating voltage as a guarantee voltage for an operation of the first determining means; and a reset signal generating means that releases reset of the logic circuit when the first determining means determines that the second voltage is equal to or higher than the reset voltage for the logic circuit and at the same time the second determining means determines that the first voltage is equal to or higher than the minimum operating voltage, and outputs a reset signal for resetting the logic circuit when the first determining means determines that the second voltage is lower than the reset voltage for the logic circuit or the second determining means determines that the first voltage is lower than the minimum operating voltage.

2. The reset detection circuit of claim 1, wherein the first determining means includes:

a voltage dividing circuit that divides the second voltage to a divided voltage; and a threshold circuit that compares the divided voltage of the voltage dividing circuit with a reference voltage corresponding to the reset voltage to determine whether the second voltage is equal to or higher than the reset voltage.

3. The reset detection circuit of claim 1, wherein the second determining means includes:

a voltage dividing circuit that divides the first voltage to a divided voltage; and a threshold circuit that compares the divided voltage of the voltage dividing circuit with a reference voltage corresponding to a minimum operating voltage to determine whether the first voltage is equal to or higher than the minimum operating voltage.

4. The reset detection circuit of claim 1, wherein:

the first determining means includes a first voltage dividing circuit that divides the second voltage to a first divided voltage, and a first threshold circuit that compares the first divided voltage of the first voltage dividing circuit with a first reference voltage corresponding to the reset voltage to determine whether the second voltage is equal to or higher than the reset voltage;

the second determining means includes a second voltage dividing circuit that divides the first voltage to a second divided voltage, and a second threshold circuit that compares the second divided voltage of the second voltage dividing circuit with a second reference voltage corresponding to a minimum operating voltage to determine whether the first voltage is equal to or higher than the minimum operating voltage; and the first reference voltage and the second reference voltage are equal to each other.

5. The reset detection circuit of claim 1, wherein:

the reset voltage for the logic circuit is equal to a guarantee voltage for retaining a charge of a RAM; and the logic circuit and the RAM are reset based on a determination of the first determining means as to whether the second voltage is equal to or higher than the reset voltage for the logic circuit.

6. The reset detection circuit of claim 1, further comprising:

a third power supply line that supplies a third voltage; and a third determining means that operates with the first voltage and determines whether the third voltage is equal to or higher than a guarantee voltage for retaining a charge of a RAM, wherein the reset signal generating means releases the reset of the logic circuit when the first determining means determines that the second voltage is equal to or higher than the reset voltage for the logic circuit, the second determining means determines that the first voltage is equal to or higher than the minimum operating voltage, the third determining means determines that the third voltage is equal to or higher than the guarantee voltage for retaining the charge of the RAM, and wherein the reset signal generating means outputs the reset signal for resetting the logic circuit and the RAM when the first determining means determines that the second voltage is lower than the reset voltage of the logic circuit, the second determining means determines that the first voltage is lower than the minimum operating voltage, or the third determining means determines that the third voltage is lower than the guarantee voltage for retaining the charge of the RAM.

7. The reset detection circuit of claim 6, wherein the third determining means includes:

a voltage dividing circuit for dividing the third voltage to a divided voltage; and a threshold circuit for comparing the divided voltage of the voltage dividing circuit with a reference voltage corresponding to the guarantee voltage for retaining the charge of the RAM to determine whether the third voltage is equal to or higher than the guarantee voltage for retaining the charge of the RAM.

8. The reset detection circuit of claim 6, wherein the third voltage is produced from the first voltage.

9. The reset detection circuit of claim 1, wherein the reset voltage is lower than the minimum operating voltage.

10. A semiconductor integrated circuit including the reset detection circuit of claim 1.

* * * * *